United States Patent [19]

St. Louis et al.

[11] 4,214,364
[45] Jul. 29, 1980

[54] HERMETIC AND NON-HERMETIC PACKAGING OF DEVICES

[75] Inventors: Jacques R. St. Louis, Ottawa; Manfred Thumm, Nepean; Geoffrey N. Gale, Woodlawn, all of Canada

[73] Assignee: Northern Telecom Limited, Montreal, Canada

[21] Appl. No.: 41,003

[22] Filed: May 21, 1979

[51] Int. Cl.³ .............................................. H01R 43/00
[52] U.S. Cl. ....................................... 29/827; 29/588; 29/589; 174/52 PE
[58] Field of Search ....................... 29/628, 589, 630 A, 29/588, 577, 583, 627; 174/52 PE

[56] References Cited

U.S. PATENT DOCUMENTS

| | | | |
|---|---|---|---|
| 3,423,638 | 1/1969 | Dix et al. | 174/52 PE |
| 3,793,714 | 2/1974 | Bylander | 29/589 X |
| 4,003,544 | 1/1977 | Bliven et al. | 29/588 X |

Primary Examiner—Milton S. Mehr
Assistant Examiner—C. J. Arbes
Attorney, Agent, or Firm—Sidney T. Jelly

[57] ABSTRACT

In the packaging of devices, such as active and passive electronic devices, the devices can be selectively hermetically sealed or non-hermetically sealed, as desired, using to a large extent common apparatus. In the limit, only the fusion sealing for hermetic devices and plastic encapsulation for non-hermetic devices need be carried out on separate machines. This is obtained by use of a particular form of lead frame, common for both forms of devices, with common apparatus and steps prior to and following the sealing or encapsulation.

11 Claims, 10 Drawing Figures

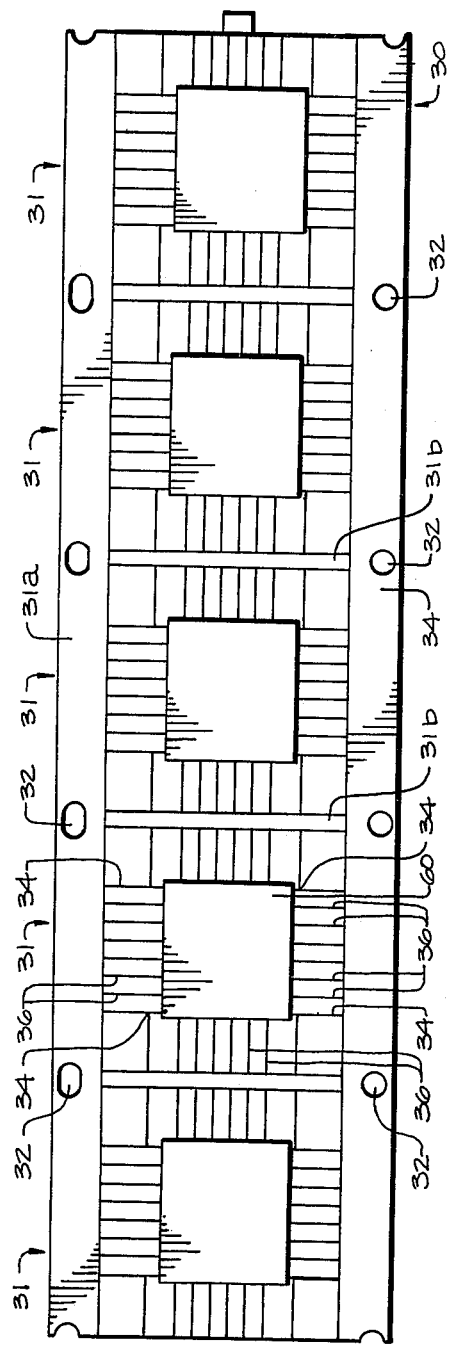
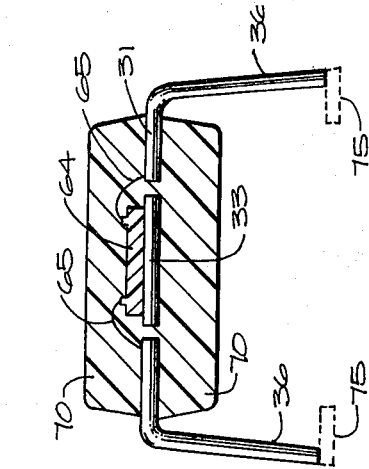
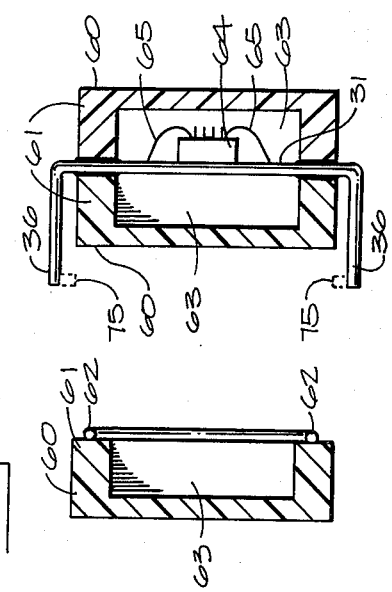
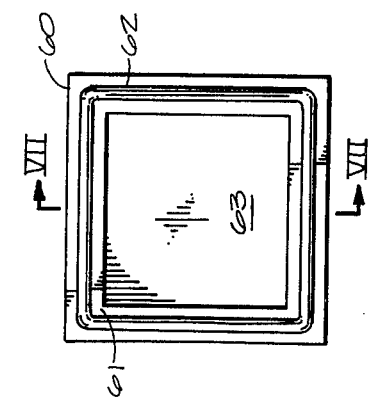

HERMETIC AND NON-HERMETIC PACKAGING OF DEVICES

This invention relates to the hermetic and non-hermetic (plastic) packaging of devices, such as active and passsive electronic devices, and is particularly concerned with the provision of a considerable degree of commonality in the packaging processes, and is also concerned with a new lead frame for use in such common processes and with packaging members for use in the hermetic process.

In the packaging of passive and active devices two methods can be used, hermetic and non-hermetic or plastic. Hermetic packaged devices are, as the name states hermetically sealed. Plastic packaged devices are not hermetically sealed but are suitable for many operating environments.

Hermetic packaging is expensive. Conventionally, individual chips or dies are mounted by hand, bonded to a base, a cap applied and then fused.

Non-hermetic packaging is usually done in strips, the chips or dies applied to pads in a lead frame, the chips usually applied by hand. Bonding may be manual or automatic. The final device is then molded within plastic.

Thus, in a device packaging plant, the chips or dies proceed on two separate paths after die separation and sorting, with differing forms of apparatus. In particular, the hermetic process is slower and more expensive and more labour intensive.

The present invention provides for the hermetic and non-hermetic packaging of passive and active electrical and electronic devices, and is particularly suitable for semiconductor devices, using a common lead frame in strip form, with, at the limit, only the molding or sealing steps being carried out separately, although generally the wire bonding will also be carried out separately when gold wire is required for the plastic molding and aluminum wire for the sealing (fusing).

Broadly, in accordance with the invention, after wafers have been tested, followed by die separation and sorting, the dies are attached to a common lead frame. Then if gold wire bonding is used with plastic molding and aluminum wire bonding used with hermetic sealing, the lead frame separate, going to either aluminum wire bond and then to plastic molding or to gold wire bond and then to capping and sealing. After either of these steps the lead frames come together for plating of leads, trimming and forming, and final test. If common wire bonding can be used then the lead frames separate only after wire bonding, to go to either plastic molding or capping and sealing.

The lead frame is formed with the normal leads extending from a central die pad, the number depending upon the particular lead count for the devices being packaged. The central die pad is also connected to the frame with lead-like members projecting radially from each corner of the die pad.

The invention will be readily understood by the following description in conjunction with the accompanying drawings, in which:

FIG. 5 is a plan view of a lead frame strip, after hermetic sealing or plastic encapsulation;

FIG. 6 is a plan view of one of the members which can be used for the hermetic sealing;

FIG. 7 is a cross-section on the line VII—VII of FIG. 6;

FIG. 8 is a cross-section through a hermetically sealed package using members as in FIGS. 6 and 7;

FIG. 9 is a cross-section through a non-hermetic sealed package;

Figure 1:
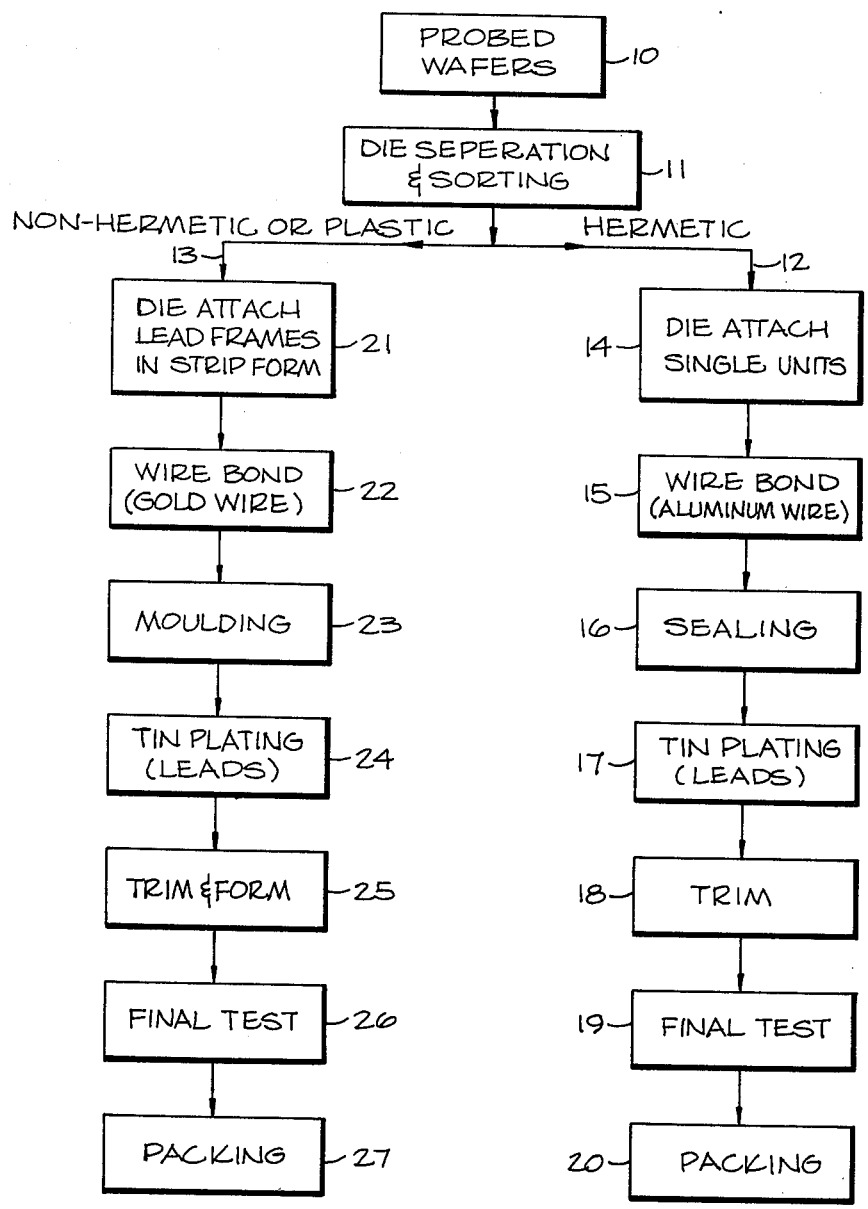
FIG. 1 is a flow line diagram of conventional packaging sequences for hermetic and non-hermetic devices.

FIG. 1 illustrates diagrammatically a typical flow line system for hermetic and non-hermetic packaging. After wafers have been processed, in the conventional manner, to produce a large number of chips or dies, each having circuitry thereon, the dies are tested by testing apparatus which usually comprises a series of probes which move down into contact with contact pads on the dies, the testing apparatus including test circuitry for checking the circuitry on the dies. The dies are generally moved sequentially beneath the probes, and any dies which are faulty are marked by coloured ink. This is indicated at 10 in FIG. 1. After testing the wafers are broken up into the separate dies and sorted—at 11. From here, in the conventional systems, the dies proceed along two entirely separate paths depending upon whether they are to be hermetically sealed or non-hermetically sealed. In FIG. 1 the hermetic seal path is designated 12 and the non-hermetic 13.

Taking first path 12—hermetic packaging, the dies are handled individually and attached individually to the die pad of a single lead frame at 14. The leads are then wire bonded, using aluminum wire, to respective pads on the die at 15. At this stage the lead frame is resting on a bottom ceramic member which forms half of the hermetic package or seal. The ceramic member has a bead of glass or similar fusible material on its upper surface around the periphery thereof. A ceramic cap is then positioned on the bottom ceramic member and lead frame. This cap also has a bead of glass or similar fusible material adjacent its periphery, the two beads in opposition. The assembly is then passed through a furnace where the beads fuse and hermetically seal the two ceramic members together, the leads extending out from between the members and hermetically sealed to them. This is indicated at 16.

Following sealing, the leads are tin plated—at 17—and then the frame itself trimmed off leaving the leads extending from the package at 18. The leads are then bent down, the package tested—at 19—and then the hermetic sealed units packed for transport.

Turning now to path 12, non-hermetic or plastic packaging, the dies are attached to the die pads of a number of lead frames in strip form—step 21. The leads are wire bonded, using gold wire, at 22, and then the strip of lead frames with dies passed to a molding die where the individual dies and associated leads are embedded in plastic, at 23. The leads extend from the plastic and these are tin plated, at 24. The frames are then trimmed off leaving the leads extending and the leads are then bent down—at 25. The packaged dies are tested, at 26, and then the plastic embedded on non-hermetic units are packed for transport, at 27.

Thus two completely separate assembly or packaging lines are provided with separate apparatus. For non-hermetic or plastic packaging lead frames in strips can be used, but for hermetic packaging the devices are handled individually.

With respect to the present invention, a lead frame strip of a particular formation is used for both forms of packaging and the majority of packaging steps are carried out on the same apparatus. The result is cheaper packaging, particularly for the hermetic packaging, with the opportunity of more effective use of space, labour and apparatus.

Figure 2:
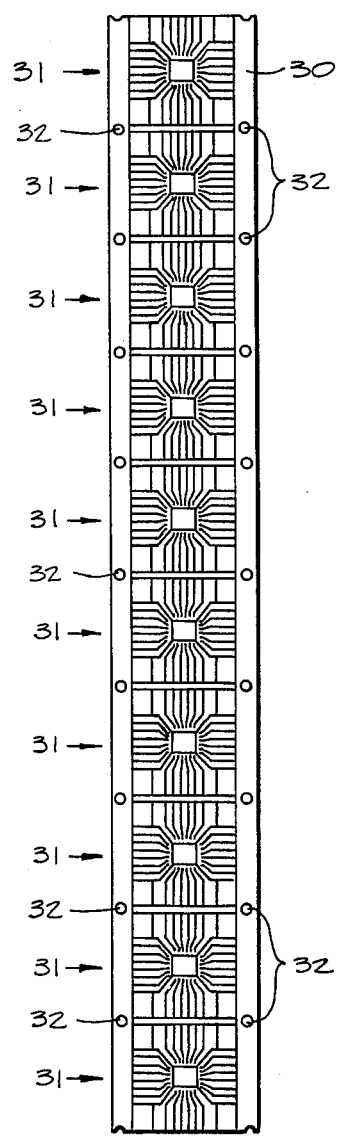
FIG. 2 is a plan view of a novel lead frame strip in accordance with the present invention, having ten frames or positions.
Figure 3:
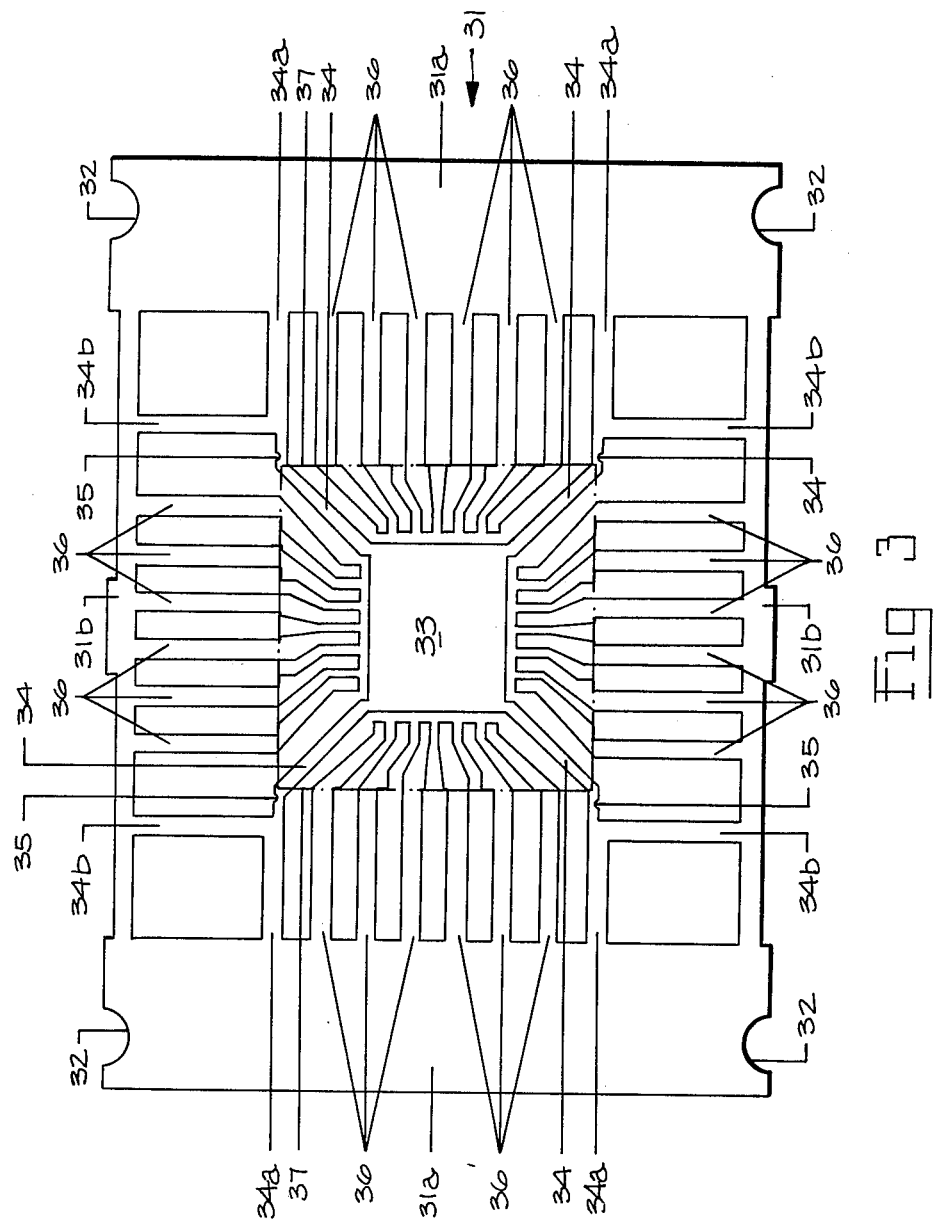
FIG. 3 is an enlarged view of one of a single frame or position of the lead frame strip of FIG. 2.

FIGS. 2 and 3 illustrate a form of lead frame as used in and forming a feature of the present invention. FIG. 2 illustrates a strip 30 of ten lead frames indicated generally at 31, a single frame being illustrated in FIG. 3 to a much larger scale. The strip is provided with locating holes 32 along each side. The strips of lead frames can be formed by any conventional process, for example by photolithographically etching from a strip of metal such as Kovar (TM). This metal has a coefficient of expansion closely matching silicon. Other materials can be used.

In FIG. 3 can be seen the die pad 33 to which is attached the die, as by epoxy resin. The die pad 33 is attached to the frame 31 by four radially extending lead-like members 34, one from each corner of the pad 33. In the particular example, each member 34 divides into two parts, one part 34a, extending to the side member 31a of the frame 31 and the other part 34b extending to a cross member 31b. A notch 35 can be formed at the outer end of the radial portion of each member 34. In the example illustrated twenty-four leads 36 are provided, the leads extending in from the side and cross members 31a and 31b of the frame, with the inner ends stopping just short of the die pad 33. The shear line for the leads is indicated by chain dotted line 37.

Figure 4:
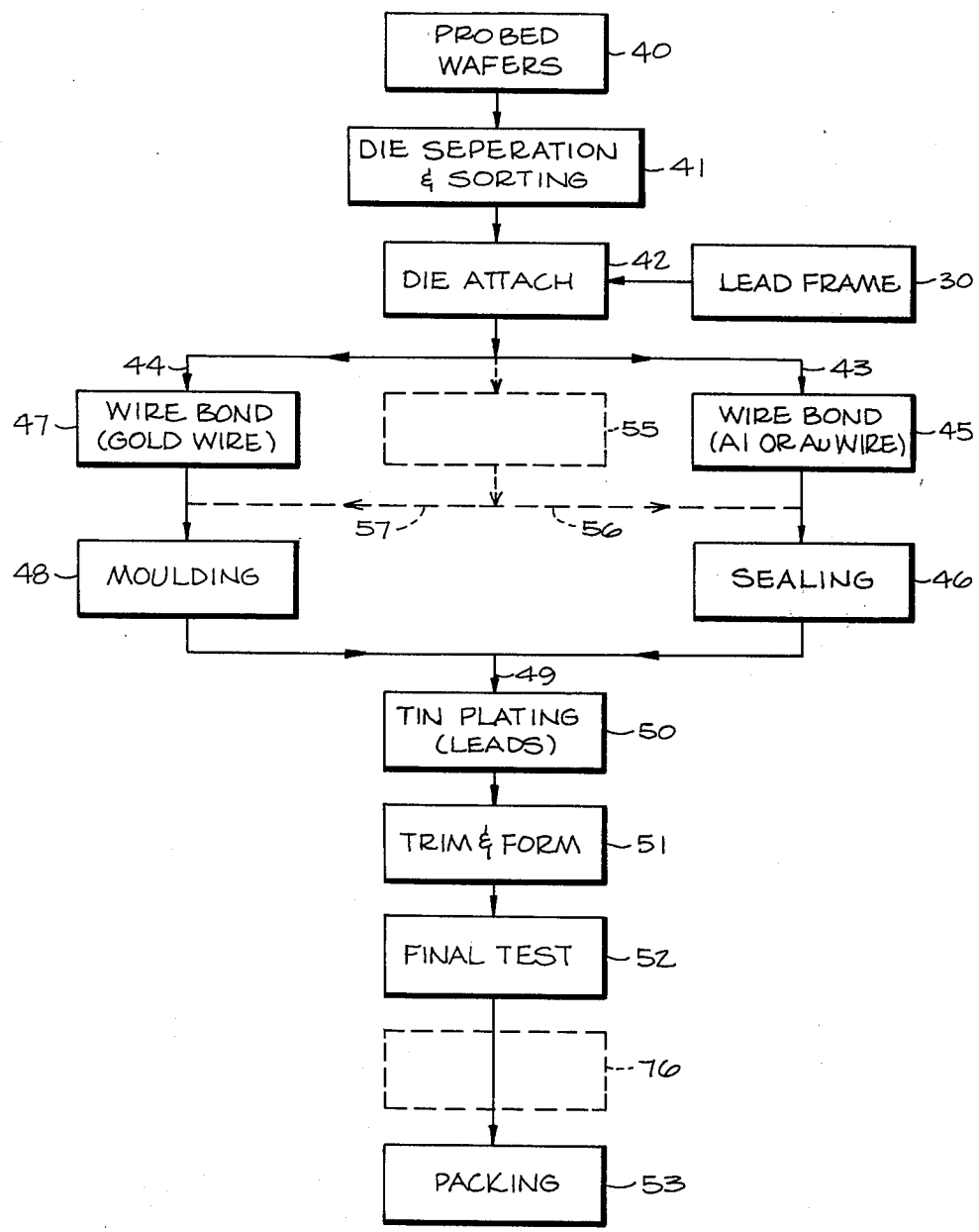
FIG. 4 is a flow line diagram in accordance with a feature of the present invention.

FIG. 4 illustrates diagrammatically a flow line, in accordance with the present invention. After processing of the wafers, the individual dies are tested as normally at test station 40. The dies are then separated and sorted at 41. Then irrespective as to whether the dies are to be hermetically or non-hermetically packaged, the dies are attached to the die pads, 33 of a lead frame strip 42, the lead frame strips 30 indicated on FIG. 4. Following die attachment, in one embodiment of the invention, the lead frame strips can follow one of two paths 43 or 44 for hermetic or non-hermetic packaging.

Following path 43, the leads are wire bonded to contact pads on the die, using aluminum wire. The lead frames rest on a ceramic bottom member at this stage—45—and then a ceramic cap is applied and the assembly passed to the sealing of fusing station 45. Both the ceramic bottom member and the cap have a peripherally extending bead of glass or other fusible materials and these beads fuse and hermetically seal the package.

Following path 44, the leads are wire bonded to contact pads on the die, using gold wire, at stage 47, and then the lead frames pass to the molding apparatus at 48, the lead frame strips, with packaged dies, rejoin to a common path 49. Passing along this path, the leads are tin plated, at 50, then the frames trimmed off and the leads bent or formed down at 51. At this stage, the devices, in whatever form of package, that is hermetic or non-hermetic, are separated for the first time. After testing at 52 the devices are packed at 53, for transport.

In an alternative arrangement the testing can be carried out prior to complete separation from the lead frame.

Thus the testing as indicated at 52 in FIG. 4, can be carried after the leads are sheared and formed, at 51 in FIG. 4, then testing carried out at 52. The testing apparatus can mark such devices as are not acceptable and then at a final separation step, indicated in dotted outline at 76 in FIG. 4, only those devices which have passed the test are separated, the separated devices then being fed to a "stick" in which the devices are stacked for loading into apparatus for attachment to circuit boards. The final separation takes place by shearing at the notches 35.

It will be appreciated that the production rate at the various steps in FIG. 4 can vary from step to step. Thus it is likely that certain items of apparatus may be required in plurality. For example, the molding apparatus, with a large die having a large number of cavities may have a production capacity higher than other steps. For example, a molding machine can have a die with 180 cavities, each cavity taking a strip of 10 dies, that is 1800 devices per shot, and can operate at 20 shots per hour, that is 36,000 devices per hour. This can be rather higher than the production rate of the die attachment apparatus, or wire bond apparatus, or other steps. This is met by providing additional machines at the slower steps all feeding into the common production line. This is likely to be more economical than reducing output of the molding machine, but this can be done, of course.

Due to the temperatures used conventionally in fusing the glass or similar sealing material in the hermetic sealing at 46, it is normally necessary to wire bond with aluminum at stage 45, to avoid gold contamination of the die. However, lower sealing temperatures are now being contemplated, using different hermetic sealing materials and it is now being considered that gold wire bonding can be used, or will shortly be able to be used, for hermetic packaged devices. In this case it will be possible to use a common wire bonding stage for both hermetic and non-hermetic packaging. Then, the lead frame strips, instead of separating along paths 43 and 44 after the die attachment at 42, will proceed along one path to the wire bond station indicated in dotted outline at 55. The lead frame strips then separating along paths 56 or 57 to either the hermetic seal station 46 or molding station 48, and then coming back together again for tin plating at 50. Thus there will only be one stage different for the two forms of packaging.

By the use of a common lead frame strip, it becomes possible to use common apparatus and methods for many of the various steps for both forms of packaging, hitherto not possible.

FIG. 5 illustrates, in plan form, a strip of lead frames after attachment of dies and wire bonding, after sealing of the ceramic members together or encapsulation by plastic material, and prior to trimming of the outer frame. It is a feature of the invention that, if desired, instead of the outer frames being trimmed off and then the leads formed, the leads 36 can be sheared from the frame and then formed, that is bent down, while the packaged die is still held in the lead frame by the corner members 34. The packaged devices can then be tested while in the strip. After testing the frame can be trimmed off by shearing of the corner members 34 at the periphery of the ceramic members. Thus, as illustrated in FIG. 4, instead of trimming and forming at stage 51, only forming would be carried out and trimming would be done between stages 52 and 53.

FIGS. 6 and 7 illustrate a form of ceramic member 60 which can be used for the hermetic packaging. The member 60 is a flat member having a raised rim 61, on which is deposited or formed a bead of glass or other fusible material 62. The rim 61 defines a recess 63. In use one of the members 60 is laid down at each of several positions corresponding to a die pad on the lead frame strip. The lead frame strip is laid down, the die pads over the recesses. The dies have previously been wire bonded to the leads. A further member 60 is then positioned over each die, with the rims 61 in opposition. The assembly is then heated and the beads fuse, sealing the two ceramic members 60 together. FIG. 8 illustrates the sealed assembly after trimming off of the outer frame of the lead frame 31 and forming of the leads 36. A die is indicated at 64 with wire leads between die and frame leads indicated at 65. The recess 63 in the cap 60 provides clearance for the die and wire leads. The recess 63 is not strictly necessary in the bottom member 60 but it conveniently enables the use of one form of member for top and bottom. If desired the bottom ceramic member can be a plain flat member, or of other suitable form.

FIG. 9 is a cross-section, similar to that of FIG. 8, illustrating a plastic encapsulated arrangement. The frame 31, with the die 64 bonded to the die pad 33 and wire leads 65 bonded to the die and frame. The whole assembly is encapsulated in plastic material 70.

Figure 10:
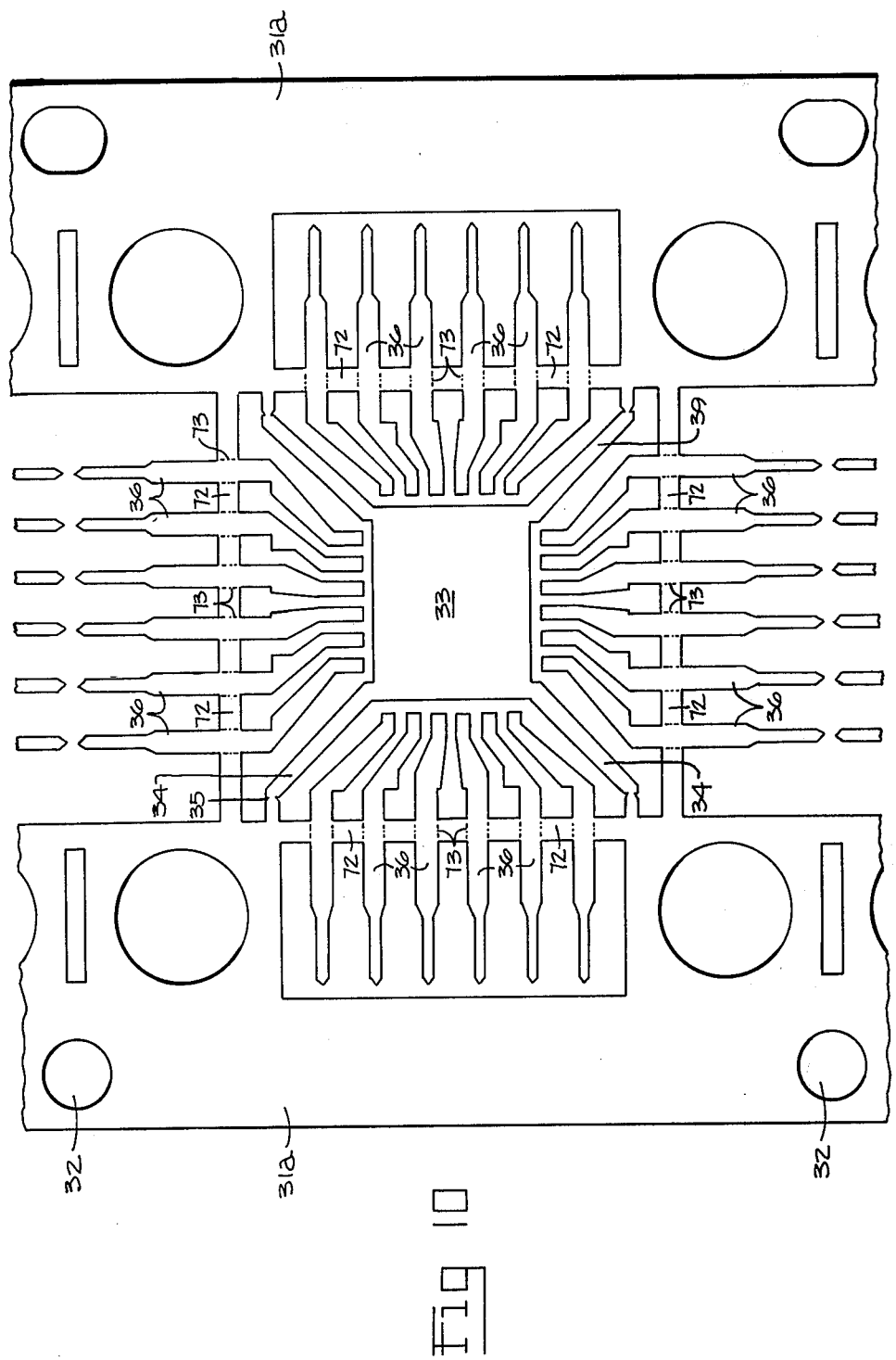
FIG. 10 is an enlarged view of a single frame of a lead frame strip, illustrating a modification thereof.

FIG. 10 illustrates a modification to the lead frame which can be provided to decrease the occurrence of excessive flash material during plastic encapsulation. A "dam" bar 72 is added to the lead frame, at each frame, extending between the leads 36 at a position which is just outside the periphery of the encapsulating material. The dam bar is either sheared out as indicated by chain dotted lines 73, at the same time as the frame is sheared from the leads or is sheared out before shearing off of the frame to enable testing to be carried out in the strip form. The dam bar forms no part of the assembly for hermetic sealing but the same frame is used and the dam bar sheared out after sealing.

FIG. 10 also illustrates a modification in which the leads 36 are extended, as compared to the leads of the lead frame illustrated in FIG. 5. Such long leads would be useful when the devices are mounted with the leads passing through holes in a circuit board. Also, with the provision of the dam bar 72 the cross-members 31b can be omitted and the ends of the leads remote from the pad 33 can be unattached to the lead frame. However, the dam bar 72 can be provided with the form of lead frame illustrated in FIG. 3.

The predominant advantage of the present invention is that there is effectively a single, common, production line for the production of either form of packaged device, with only a divergence for the hermetic or non-hermetic final form. This provides various advantages. Thus it is possible with only a diversion one way or the other after die attachment to provide the device in either of two forms, with the minimum of extra apparatus. In an attempt to reduce labour content, most steps are now automated. Thus machines are available for attaching the dies to the lead frame—or to individual lead members for conventional hermetic sealing, and for wire bonding, sealing or encapsulation. However this machinery is expensive and occupies a relatively large floor space. By the present invention the die attachment machinery is common. Also by combining into a single line, plating, trimming and forming and testing can be carried out on the same machinery. Thus, when non-hermetic devices are being formed only the wire bonding and sealing apparatus for hermetic devices is idle, and similarly, for hermetic device production only the wire bonding and encapsulation or molding apparatus is idle. Even further economies are made if common wire bonding machines are used.

A further advantage arises in that the introduction of new devices follows a series of steps. Generally the devices are produced in an hermetic form as this gives the highest confidence factor for final test. These devices are in fact often initially made by being hermetically sealed using an eutectic sealing material—instead of the fused glass. This is very expensive but the devices can still be made using the invention up to and including the die attachment apparatus, the strips then being side-stepped to a specialized sealing apparatus. The sealed devices can then be returned to the normal production line, for example at 50 in FIG. 4. Once stabilized the new design is then hermetically sealed using the fused glass system and can thus be incorporated into the production line as in the present invention. This form is still expensive, as the individual ceramic parts are expensive but any possible breaking or distortion of the wire leads or bonds is avoided and thus the final test is of the device design itself. Once production increases, with the device design finalized, plastic impregnation is used and it will be realized that it is possible to feed in what are in effect experimental batches into the system and arrange for the strips to take whichever path is required: hermetic sealing or non-hermetic, or even only use those parts of the system as desired. Thus the provision of spare apparatus is considerably reduced or even obviated.

While it is feasible for the leads 36 to be inserted through holes in a circuit board, it is more likely that the packaged devices will be surface mounted. That is the ends of the leads will be soldered to contact pads or areas on the circuit board. At present devices are provided for surface mounting but instead of leads, as in FIGS. 8 and 9, contact pads are provided on the base of the device, the pads resting on and being soldered to contact pads or areas on the circuit board. However, by providing leads, some clearance is provided between the device and the circuit board. This enables cleaning to be provided to ensure no foreign matter is trapped between device and board. This can be very important as the device is often positioned over circuit patterns under the device. The surface mounting of devices as produced by the present invention can be handled by existing apparatus.

For surface mounting, it would be useful to have "feet" formed at the ends of the leads. This can be provided by a two step forming at the time the leads are sheared from the lead frame. Thus on shearing, the extreme ends of the leads can be bent at 90° and then a second forming step will bend down the leads. Feet are indicated in dotted outline at 75 in FIGS. 8 and 9.

By using the invention, devices are produced with extremely close spacing of beads and a very small overall size. Very high device density can be provided. As stated, the term device is intended to include dies or chips which carry both active and inactive devices. The dies can carry integrated circuits, which may include various forms of electrical and electronic devices, or the dies may carry such items as thick film devices, transformers, coils and other devices which can be formed on the dies, while in wafer form, and then after die separation are hermetically sealed or non-hermetically or plastic encapsulated.

What is claimed is:

1. A method of hermetic and non-hermetic packaging of devices, comprising:
   providing a plurality of lead frame strips, each strip including a plurality of lead frames, each lead frame including a die mounting position and a plurality of leads associated with each die mounting position;
   feeding said strips sequentially to a die mounting apparatus and mounting a die at each said die mounting position;
   feeding said strips to a wire bonding position and wire bonding said dies to said leads;
   selectively feeding said strips alternatively to one of an hermetic sealing apparatus and a non-hermetic sealing apparatus, to form a plurality of packaged devices on each strip, a device at each frame;
   trimming and forming said leads;
   separating said packaged devices from said strips.

2. A method as claimed in claim 1, including the step of plating said leads prior to trimming and forming.

3. A method as claimed in claim 1, including testing said devices prior to separating from said strips and after forming said leads.

4. A method as claimed in claim 1, including selectively feeding said strips alternatively to a first wire bonding position prior to hermetic sealing and a second wire bonding position prior to non-hermetic sealing.

5. A method as claimed in claim 4, including gold wire bonding at said first wire bonding position.

6. A method as claimed in claim 4, including aluminum wire bonding at said second wire bonding position.

7. A method as claimed in claim 1, said non-hermetic sealing apparatus comprising a plastic encapsulating apparatus.

8. A method as claimed in claim 1, each lead frame comprising:
   a rectangular die mounting pad;
   a frame surrounding said pad and spaced therefrom;
   a plurality of leads extending from said frame towards said pad and having ends spaced a short distance from said pad;
   a member extending from each corner of said pad to said frame, whereby on trimming and forming said leads said members remain attached to said pad and said frame, said members sheared to separate said package devices from said strip.

9. A method as claimed in claim 1, including the steps of testing prepared wafers, separating and sorting dies from said wafers, and feeding dies for mounting at said die mounting positions.

10. A method as claimed in claim 1, including feeding said separated packaged devices to a packing position and packing said devices for feeding to further apparatus.

11. A method as claimed in claim 1, including feeding said lead frames in strips of a predetermined number of lead frames.

* * * * *